US008722461B2

(12) United States Patent
Sirinorakul

(10) Patent No.: US 8,722,461 B2
(45) Date of Patent: May 13, 2014

(54) LEADFRAME BASED MULTI TERMINAL IC PACKAGE

(71) Applicant: UTAC Thai Limited, Bangkok (TH)

(72) Inventor: Saravuth Sirinorakul, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 0 days.

(21) Appl. No.: 13/769,021

(22) Filed: Feb. 15, 2013

(65) Prior Publication Data
US 2013/0210197 A1 Aug. 15, 2013

Related U.S. Application Data

(62) Division of application No. 13/045,253, filed on Mar. 10, 2011, now Pat. No. 8,575,732.

(60) Provisional application No. 61/313,009, filed on Mar. 11, 2010.

(51) Int. Cl.
*H01L 21/00* (2006.01)
*H01L 23/495* (2006.01)

(52) U.S. Cl.
CPC ........ *H01L 23/495* (2013.01); *H01L 23/49537* (2013.01)
USPC ............................ 438/110; 438/113; 438/123

(58) Field of Classification Search
CPC .................. H01L 23/495; H01L 23/49537
USPC ........................................ 438/110, 113, 123
See application file for complete search history.

(56) References Cited

U.S. PATENT DOCUMENTS

| | | | |
|---|---|---|---|
| 3,611,061 A | 10/1971 | Segerson |
| 4,411,719 A | 10/1983 | Lindberg |
| 4,501,960 A | 2/1985 | Jouvet et al. |
| 4,801,561 A | 1/1989 | Sankhagowit |
| 4,855,672 A | 8/1989 | Shreeve |
| 5,105,259 A | 4/1992 | McShane et al. |
| 5,195,023 A | 3/1993 | Manzione et al. |
| 5,247,248 A | 9/1993 | Fukunaga |
| 5,248,075 A | 9/1993 | Young et al. |
| 5,281,851 A | 1/1994 | Mills et al. |
| 5,396,185 A | 3/1995 | Honma et al. |
| 5,397,921 A | 3/1995 | Karnezos |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,990,692 A | 11/1999 | Jeong et al. |
| 6,072,239 A | 6/2000 | Yoneda et al. |
| 6,111,324 A | 8/2000 | Sheppard et al. |
| 6,159,770 A | 12/2000 | Tetaka et al. |
| 6,177,729 B1 | 1/2001 | Benenati et al. |

(Continued)

*Primary Examiner* — Phat X Cao
(74) *Attorney, Agent, or Firm* — Haverstock & Owens LLP

(57) ABSTRACT

A semiconductor package comprises a die attach pad and a support member at least partially circumscribing it. Several sets of contact pads are attached to the support member. The support member is able to be etched away thereby electrically isolating the contact pads. A method for making a leadframe and subsequently a semiconductor package comprises partially etching desired features into a copper substrate, and then through etching the substrate to form the support member and several sets of contact pads. Die attach, wirebonding and molding follow. The support member is etched away, electrically isolating the contact pads and leaving a groove in the bottom of the package. The groove is able to be filled with epoxy or mold compound.

18 Claims, 12 Drawing Sheets

(56) References Cited

U.S. PATENT DOCUMENTS

| | | |
|---|---|---|
| 6,197,615 B1 | 3/2001 | Song et al. |
| 6,208,020 B1 | 3/2001 | Minamio et al. |
| 6,229,200 B1 | 5/2001 | Mclellan et al. |
| 6,242,281 B1 | 6/2001 | Mclellan et al. |
| 6,250,841 B1 | 6/2001 | Ledingham |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,376,921 B1 | 4/2002 | Yoneda et al. |
| 6,392,427 B1 | 5/2002 | Yang |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,489,218 B1 | 12/2002 | Kim et al. |
| 6,498,099 B1 | 12/2002 | McLellan et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,667,191 B1 | 12/2003 | McLellan et al. |
| 6,683,368 B1 | 1/2004 | Mostafazadeh |
| 6,686,667 B2 | 2/2004 | Chen et al. |
| 6,703,696 B2 | 3/2004 | Ikenaga et al. |
| 6,723,585 B1 | 4/2004 | Tu et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,893,169 B1 | 5/2005 | Exposito et al. |
| 6,894,376 B1 | 5/2005 | Mostazadeh et al. |
| 6,897,428 B2 | 5/2005 | Minamio et al. |
| 6,927,483 B1 | 8/2005 | Lee et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,045,883 B1 | 5/2006 | McCann et al. |
| 7,049,177 B1 | 5/2006 | Fan et al. |
| 7,052,935 B2 | 5/2006 | Pai et al. |
| 7,060,535 B1 * | 6/2006 | Sirinorakul et al. .......... 438/123 |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,125,747 B2 | 10/2006 | Lee et al. |
| 7,205,178 B2 | 4/2007 | Shiu et al. |
| 7,224,048 B1 | 5/2007 | McLellan et al. |
| 7,247,526 B1 | 7/2007 | Fan et al. |
| 7,253,503 B1 | 8/2007 | Fusaro et al. |
| 7,259,678 B1 | 8/2007 | Brown et al. |
| 7,274,088 B2 | 9/2007 | Wu et al. |
| 7,314,820 B2 | 1/2008 | Lin et al. |
| 7,315,077 B2 | 1/2008 | Choi et al. |
| 7,315,080 B1 | 1/2008 | Fan et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,459,345 B2 | 12/2008 | Hwan |
| 7,482,690 B1 | 1/2009 | Fan et al. |
| 7,495,319 B2 | 2/2009 | Fukuda et al. |
| 7,507,603 B1 | 3/2009 | Berry et al. |
| 7,595,225 B1 | 9/2009 | Fan et al. |
| 7,608,484 B2 | 10/2009 | Lange et al. |
| 7,709,857 B2 | 5/2010 | Kim et al. |
| 7,714,418 B2 | 5/2010 | Lim et al. |
| 8,035,207 B2 | 10/2011 | Camacho et al. |
| 2001/0007285 A1 | 7/2001 | Yamada et al. |
| 2002/0109214 A1 | 8/2002 | Minamio et al. |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2003/0234454 A1 | 12/2003 | Pedron et al. |
| 2004/0014257 A1 | 1/2004 | Kim et al. |
| 2004/0026773 A1 | 2/2004 | Koon et al. |
| 2004/0046237 A1 | 3/2004 | Abe et al. |
| 2004/0046241 A1 | 3/2004 | Combs et al. |
| 2004/0070055 A1 | 4/2004 | Punzalan et al. |
| 2004/0080025 A1 | 4/2004 | Kasahara et al. |
| 2004/0110319 A1 | 6/2004 | Fukutomi et al. |
| 2005/0003586 A1 | 1/2005 | Shimanuki et al. |
| 2005/0077613 A1 | 4/2005 | McLellan et al. |
| 2005/0236701 A1 | 10/2005 | Minamio et al. |
| 2005/0263864 A1 | 12/2005 | Islam et al. |
| 2006/0071351 A1 | 4/2006 | Lange |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0273433 A1 | 12/2006 | Itou et al. |
| 2007/0001278 A1 | 1/2007 | Jeon et al. |
| 2007/0013038 A1 | 1/2007 | Yang |
| 2007/0029540 A1 | 2/2007 | Kajiwara et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2009/0152691 A1 | 6/2009 | Nguyen et al. |
| 2009/0152694 A1 | 6/2009 | Bemmert et al. |
| 2009/0230525 A1 | 9/2009 | Chang Chien et al. |
| 2009/0236713 A1 | 9/2009 | Xu et al. |
| 2010/0133565 A1 | 6/2010 | Cho et al. |
| 2010/0149773 A1 | 6/2010 | Said |
| 2010/0178734 A1 * | 7/2010 | Lin ............................. 438/123 |
| 2010/0224971 A1 | 9/2010 | Li |
| 2011/0115061 A1 * | 5/2011 | Krishnan et al. .............. 257/676 |
| 2011/0201159 A1 | 8/2011 | Mori et al. |

* cited by examiner

LEADFRAME BASED MULTI TERMINAL IC PACKAGE

RELATED APPLICATIONS

This application is a divisional application of co-pending U.S. patent application Ser. No. 13/045,253, filed Mar. 10, 2011, and entitled "Leadframe Based Multi Terminal IC Package," which claims benefit of priority under 35 U.S.C. section 119(e) of the U.S. Provisional Patent Application Ser. No. 61/313,009 filed Mar. 11, 2010, entitled "LEADFRAME MULTI TERMINAL IC PACKAGE," which are both hereby incorporated by reference in their entireties.

FIELD OF THE INVENTION

The present invention is related to the field of semiconductor device manufacturing. More specifically, the present invention relates to leadframes for stabilizing wire bond placement and avoiding bent leads.

BACKGROUND

In general, multiterminal integrated circuit (IC) packages are formed from a copper substrate. FIG. 1 shows such a prior art process. A bare copper substrate 100 is partially etched to pattern the contact pads 103 and the die attach pad 102. The partial etching is able to be done in any number of ways known by the person of ordinary skill. The substrate 100 is seen in cross section. The contact pads 103 are in several rows surrounding the die attach pad 102. Each row of contact pads is still an integral piece of the leadframe 100. For each row of contacts, there is one section of half etched copper in an inside perimeter and an outside perimeter. In the example provided, there are two rows of contact pads 103. There is a first etched portion 103A, a second etched portion 103B, and a third etched portion 103C. These portions must be removed before the semiconductor device can be put to use since all contacts pads 103 are electrically coupled before removal of the portions 103A, 103B, and 103C. A semiconductor die 106 is placed on the die attach pad 102. Then, wire bonds 105 are selectively mounted from the semiconductor die 106 to the contact pads 103 and die attach pad 102. Also, all of the substrate 100 but the portions 103A, 103B and 103C are coated on a bottom side with an etch resist material. The substrate 100, semiconductor device 106 and wire bonds 105 are encased in a mold compound 107. Then, the assembly is submerged in an etching solution until the portions 103A, 103B, and 103C are sacrificed, electrically isolating the contacts 103. It should be noted that two partial etching steps were required in this prior art: once to form the partial etched areas 103A, 103B, and 103C and once to sacrifice the substrate 100. In this example given, the contact pads, die attach pad and other features are substantially planar on all surfaces. If any features, such as stand offs, or the like are to be incorporated, further half etching steps are required. A staggered or stepped form factor will require an etching step for every step. As a result, thicker copper substrates are necessary. Furthermore, accuracy is sacrificed. For example, if a standoff is needed on one of the rows of contact pads 103, they must first be partially etched into the locations where the contact pads 203 will be formed. Then, the portions 103A, 103B, and 103C must be partially etched deeper.

SUMMARY OF THE DISCLOSURE

In a first aspect of the invention, a semiconductor package comprises a die attach pad, a first set of contact pads surrounding the die attach pad, a groove at least partially circumscribing the first row of contact pads, and a second set of contact pads surrounding the groove. Generally, the semiconductor package further comprises at least one semiconductor die mounted on the die attach pad and a plurality of bondwires for electrically coupling the at least one semiconductor die to at least one contact pad. Preferably, the bottom surface of the semiconductor package is substantially planar except for the groove. The groove defines a channel that substantially encompasses the first row of contact pads. The first set of contact pads generally surrounds the die attach pad and is bounded by the groove. In some embodiments, the second set of contact pads surrounds the groove and is bounded by the perimeter of the semiconductor package. In some embodiments, the bottom surface of the die attach pad and bottom surfaces of the contact pads define the substantially planar bottom surface of the package. The first and second set of contact pads are able to be offset from the groove or exposed by the groove. In some embodiments, the groove comprises an epoxy filler.

In some embodiments, the package further comprises a third set of contact pads between the first set of contact pads and the die attach pad. The third set of contact pads surrounds the die attach pad and is bounded by the first set of contact pads, the groove, and the second set of contact pads. Also, the package is able to have a fourth set of contact pads around the second set of contact pads. The fourth set of contact pads surrounds the die attach pad, the first set of contact pads, the groove, and the second set of contact pads and is bounded by the perimeter of the semiconductor package.

In another aspect of the invention, a method of making a semiconductor package comprises etching a through pattern in a metal substrate, thereby forming a die attach pad, a first set of contact pads surrounding the die attach pad and a second set of contact pads surrounding the first set of contact pads, wherein the first and the second set of contact pads are coupled with a support member. Then at least one semiconductor die is mounted on the die attach pad and bondwires electrically couple the at least one semiconductor die to at least one contact pad. Then, the semiconductor die, bondwires and contact pads are at least partially encased in a mold compound while leaving one surface of the metal substrate exposed. After, the support member is etched away, thereby electrically isolating the first and second set of contact pads with respect to each other. The groove formed by etching away the support member is able to be filled with an epoxy. In some embodiments, etching a through pattern in a metal substrate further comprises forming a third set of contact pads, the third set of contact pads surrounding the die attach pad. The third set of contact pads is able to be bounded by the first set of contact pads, the groove, the second set of contact pads and the perimeter of the package.

In another aspect of the device, a leadframe for supporting a semiconductor device, comprises a die attach pad a first set of contact pads surrounding the die attach pad, a support member at least partially circumscribing the first set of contact pads, a second set of contact pads around he support member, and an outer perimeter. At least one of the first set of contacts and the second set of contacts is anchored to the support member. Preferably, the bottom surface of the leadframe is coated with an etch resist material except for the support member to allow for the support member to be etched away thereby electrically isolating the sets of contacts with respect to each other. In some embodiments, the leadframe further comprises a third set of contacts around the die attach pad. The third set of contacts is able to be anchored to the die attach pad or the support member. The third set of contacts is bounded by the first set of contacts, the support member, and the perimeter. The leadframe is also able to comprise a fourth set of contacts around the second set of contacts. The fourth set of contacts surrounds the first, second, and third set of contacts as well as the support member. The fourth set of contacts are able to be anchored to the support member or the perimeter. As a result, when the support member is etched away, any sets of contacts anchored to it are electrically isolated with respect to each other. In embodiments where the fourth set of contacts is anchored to the perimeter, the fourth set of contacts is electrically isolated during singulation.

Advantageously, the semiconductor package described above, utilizing the method and leadframe disclosed is able to be manufactured in fewer etching steps than what is disclosed by the prior art.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein or with equivalent alternatives. Reference will now be made in detail to implementations of the present invention as illustrated in the accompanying drawings. The same reference indicators will be used throughout the drawings and the following detailed description to refer to the same or like parts. The person of ordinary skill having the benefit of this disclosure will readily appreciate that elements from the several drawings are interchangeable between the embodiments shown and described.

Figure 1:
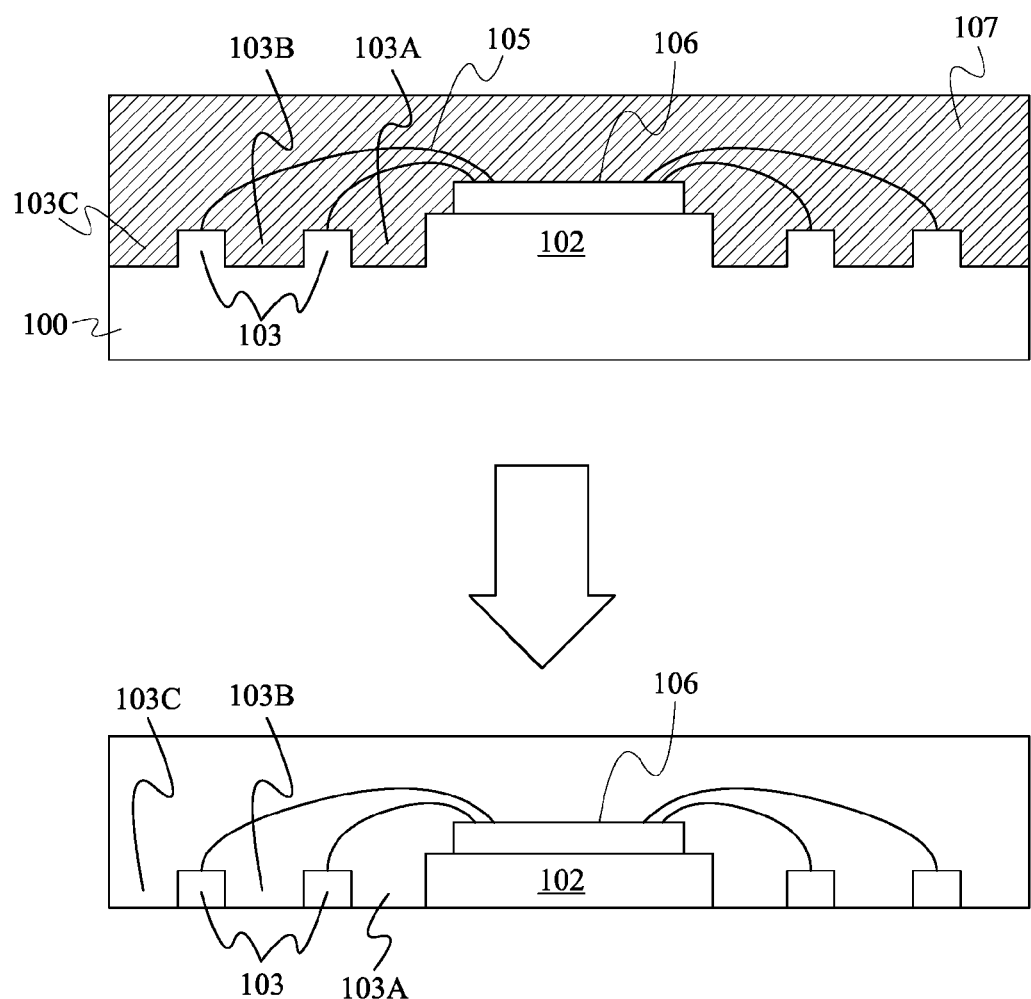
FIG. 1 is a prior art leadframe.
Figure 2:
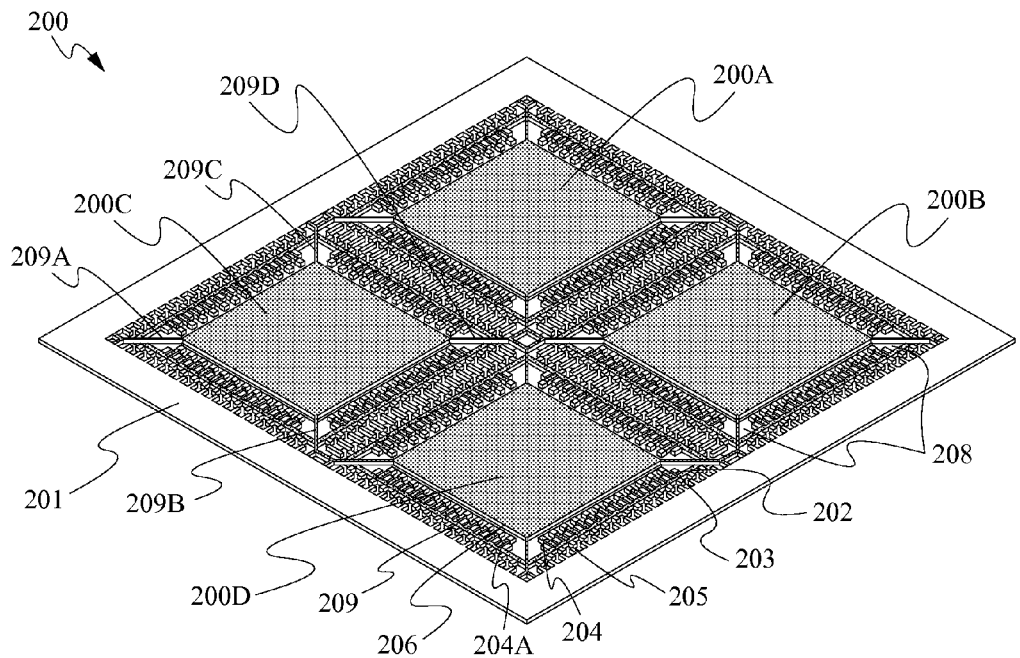
FIG. 2 is a leadframe per an embodiment of this invention shown from a front and back view.
Figure 2:
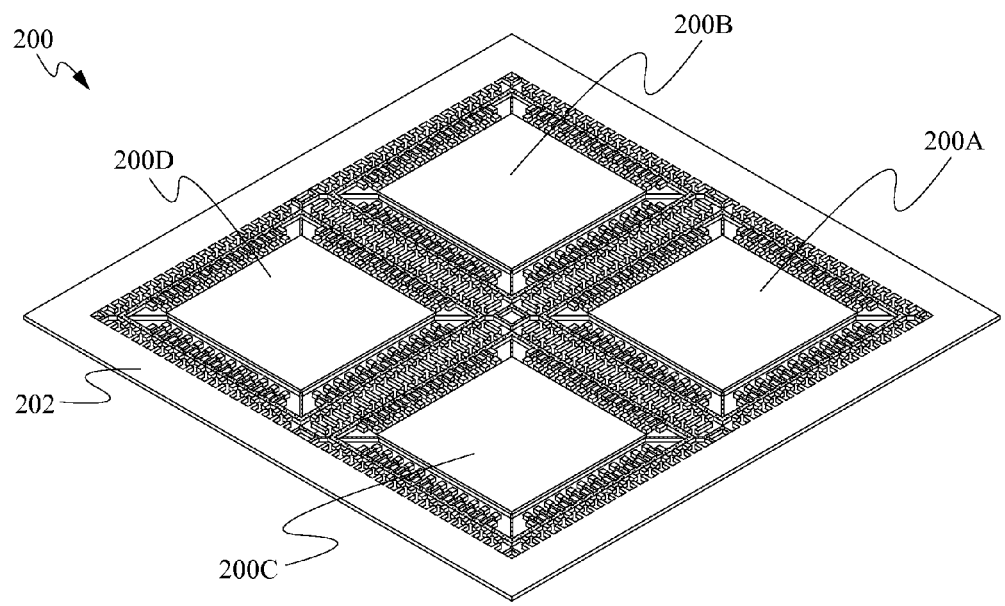

In general, the invention described below effectuates the manufacture of high density, multi row leadframes and semiconductor packages in fewer process steps; specifically using fewer etching steps. It is well known that the semiconductor industry is extremely cost driven and fewer processing steps leads to higher throughput and lower cost. FIG. 2 shows a leadframe 200 per one embodiment of this invention from a top view and a bottom view. In this exemplary embodiment, the leadframe 200 is a matrix of four individual units 200A, 200B, 200C, and 200D supported by a frame 201. The top view shows the top surface. The top surface is the surface on which at least one semiconductor die (not shown) will eventually be mounted. The bottom view shows the bottom surface. The bottom surface will eventually be the surface mounted to an end application such as a circuit board.

Preferably, the leadframe 200 has been through-etched to reveal several structures thereon, and leave behind a completely etched away portion 208. Each individual unit 200A, 200B, 200C, and 200D comprises a die attach pad 206. The die attach pad 206 is configured to support an eventual semiconductor die that will be mounted thereto. On a top surface, the die attach pad 206 is exposed copper. On a bottom side, the die attach pad is preferably coated with an etch resist material. Surrounding each die attach pad 206 is a first set of contact pads 202. The first set of contact pads 202 are preferably anchored to a support member 209 that at least partially circumscribes the die attach pad 206. The support member 209 is anchored to the die attach pad 206 by cross members 209A-209D. In some embodiments, the cross members 209A-209D are substantially co-planar with the support member 209. Alternatively, the cross members 209A-209D are raised with respect to the support member 209. Preferably, the first set of contact pads 202 are anchored to the support member 209. The first set of contact pads 202 surrounds the die attach pad 206 and is bounded by the support member 209. The leadframe 200 further comprises a second set of contact pads 203. The second set of contact pads 203 is preferably anchored to the support member 209. The second set of contact pads 203 surrounds the support member 209 and is bounded by the frame 201 or another individual unit 200A-200D. Preferably, the second set of contact pads 203 is anchored to the support member 209.

In some embodiments, the leadframe 200 further comprises a third set of contacts 204. The third set of contacts 204 surrounds the die attach pad 206 and is bounded by the first set of contact pads 202, support member 209, second set of contacts 203 and the frame 201. The third set of contacts 204 is able to be anchored to the support member 209. In order to offset the third set of contacts 204 from the first set of contacts 202 while maintaining their position between the die attach pad 206 and the first set of contacts 202, the third set of contacts 204 are anchored to the support member 209 by anchor bars 204A. Preferably, the anchor bars 204A are elevated with respect to the support member 209. Advantageously, in a later processing step when the support member 209 is sacrificed, the anchor bars 204A will be elevated with respect to the bottom surface of a resulting semiconductor package.

In some embodiments, the leadframe 200 further comprises a fourth set of contacts 205. The fourth set of contacts 205 surrounds the die attach pad 206, first set of contacts 202, third set of contacts 204, the support member 209, and the second set of contact 203. The fourth set of contacts 205 is bounded by the frame 201. In the example shown in FIG. 2, the fourth set of contacts 205 is anchored to the frame 201. Alternatively, the fourth set of contacts 205 is able to be anchored to the support member 209 via anchor bars (not shown). On the bottom side, the leadframe 200 is substantially coated in an etch resist material as indicated by the striped area. Preferably, the support member 209 is not coated with an etch resist material. Advantageously, during a later etch process, the support member 209 will be sacrificed. Upon etching away of the support member 209, the sets of contacts 202-205 that are anchored to the support member 209 are electrically isolated from one another. The individual units 200A, 200B, 200C, and 200D have square arrays of contact pads, wherein every side of each individual unit has the same number of contact pads. Alternatively, each side can have a different number of contact pads. In general, each side can have the same or different number of contact pads. However, rectangular individual units 200A, 200B, 200C, and 200D are also able to be realized.

Figure 3A:
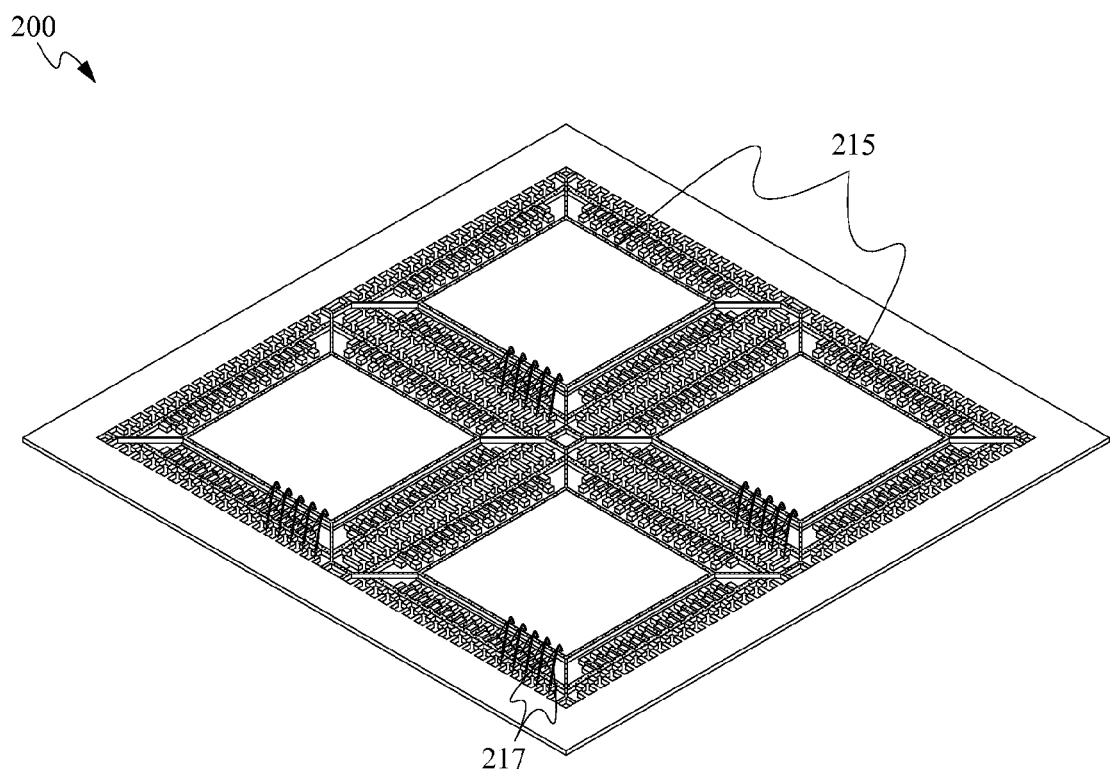
FIG. 3A shows the leadframe of FIG. 2 having die and wirebonds mounted thereon.
Figure 3B:
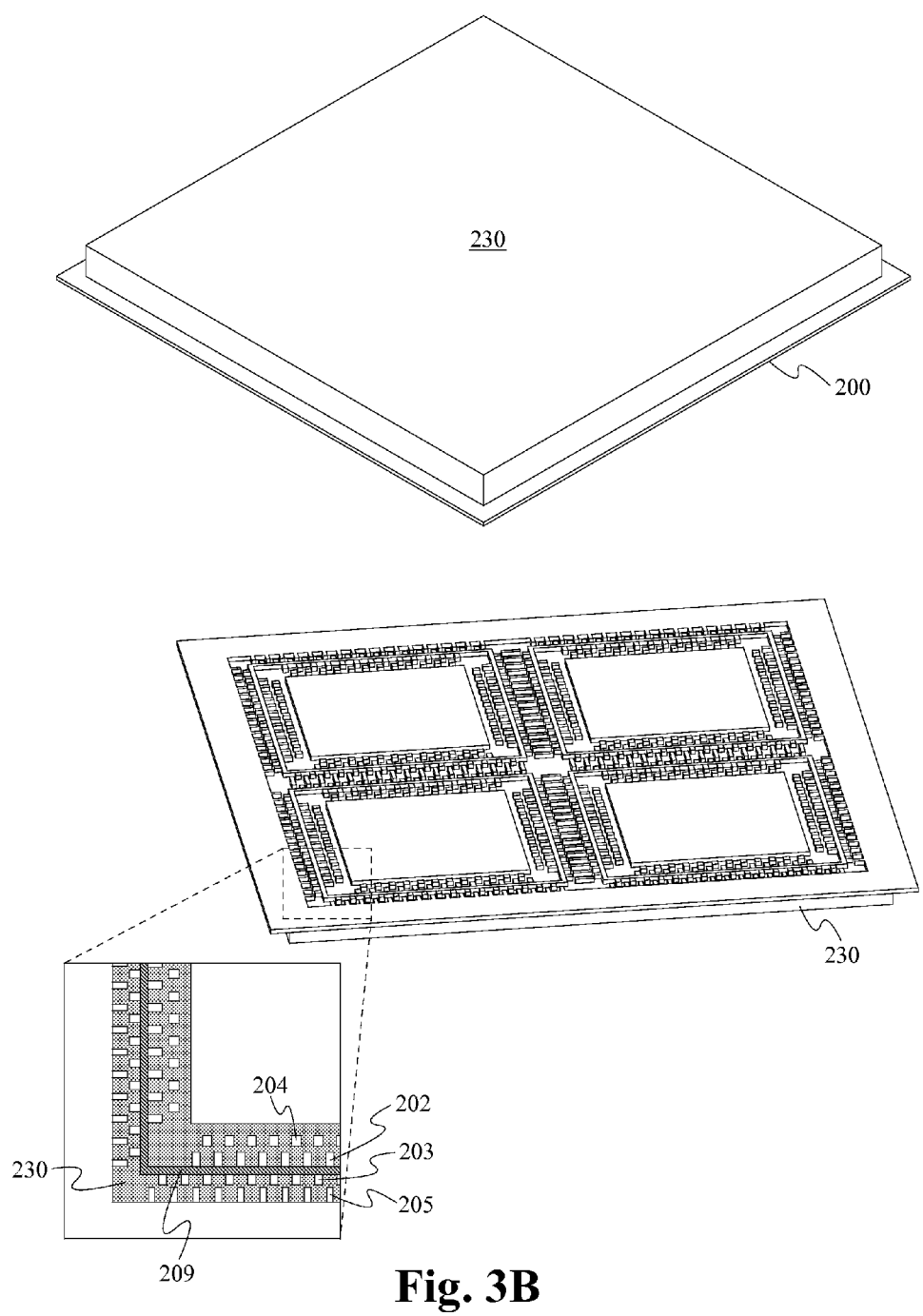
FIG. 3B shows the leadframe of FIG. 2 encapsulated in molding compound.

FIG. 3A shows the leadframe 200 of FIG. 2 in later processing steps for forming a semiconductor package. The leadframe 200 has semiconductor die 215 mounted on the die attach pads 206. In the example shown, there is one semiconductor die 215 per die attach pad 206. As applications require, multiple semiconductor die may be mounted on the die attach pads 206. The semiconductor die 215 are electrically coupled to the multiple contact pads of the several sets described so far by bondwires 217. In some embodiments, the bondwires 217 are gold. FIG. 3B shows the leadframe 200 encased in a mold compound 230 from a top view and a bottom view. Preferably, the mold compound 230 encases the semiconductor die 215 and bondwires 217 of FIG. 3A. In the exploded box of the bottom view, the etched away portion 208 first shown in FIG. 2 is depicted filled in with mold compound 230. The first set of contacts 202 and second set of contacts 203 are adjacent to the support member 209. The support member 209 is not coated in a etch resistant material indicated by the shaded regions. The third set of contacts 204 and fourth set of contacts 205 are exposed in order to make contact with a circuit board in a final application. The anchor bars 204A of FIG. 2 that anchored the third set of contacts 204 to the support member 209 are encased within the mold compound 230. In embodiments where the fourth set of contacts 205 are anchored to the support member 209, the anchor bars used to anchor them are also embedded within the mold compound as well. Preferably, the bottom surfaces of the die attach pad 206, the mold compound 230 that has filled the etched away portion 208, and the first, second, third and fourth set of contacts 202-205 define a substantially planar surface. Alternatively, the mold compound 230 filled into the etched away portion 208 is able to be recessed with respect to a substantially planar portion defined by the bottom surfaces of the several sets of contacts 202-205 and die attach pad 206.

Figure 3C:
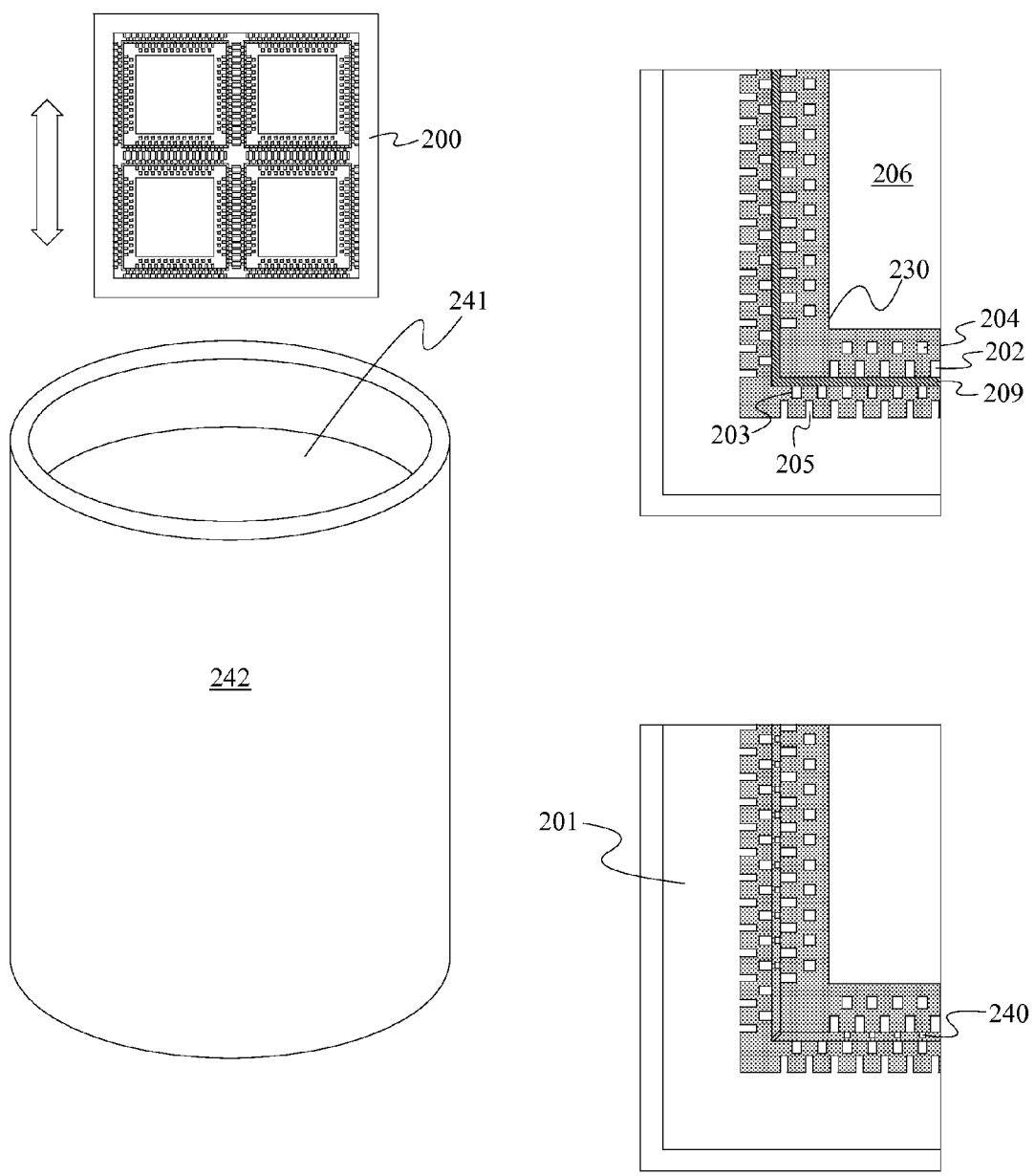
FIG. 3C shows the leadframe of FIG. 2 in an etching process.
Figure 3D:
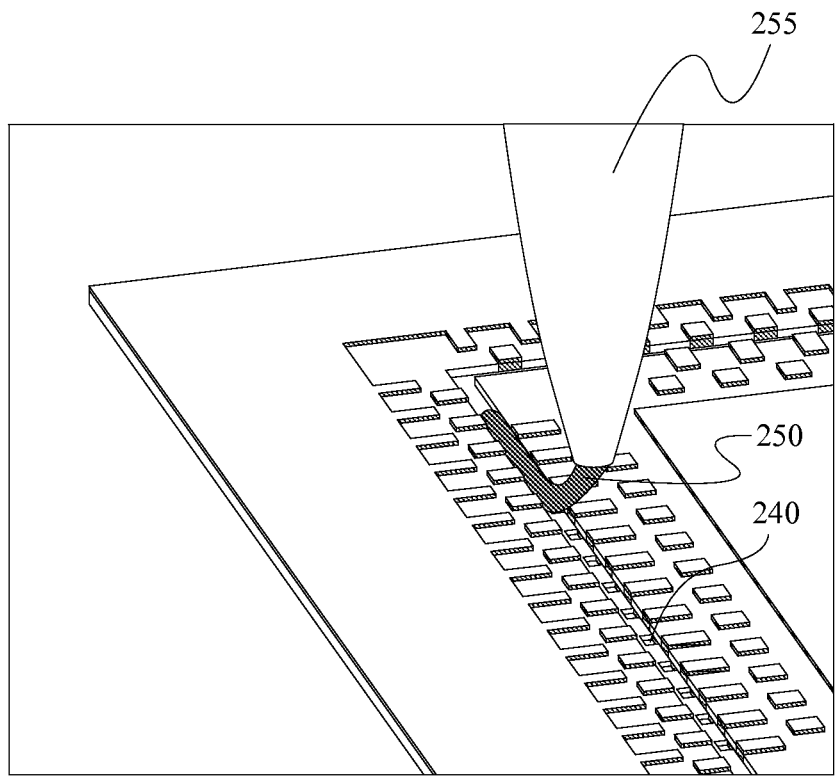
FIG. 3D shows the leadframe of FIG. 2 in an epoxy process.
Figure 3E:
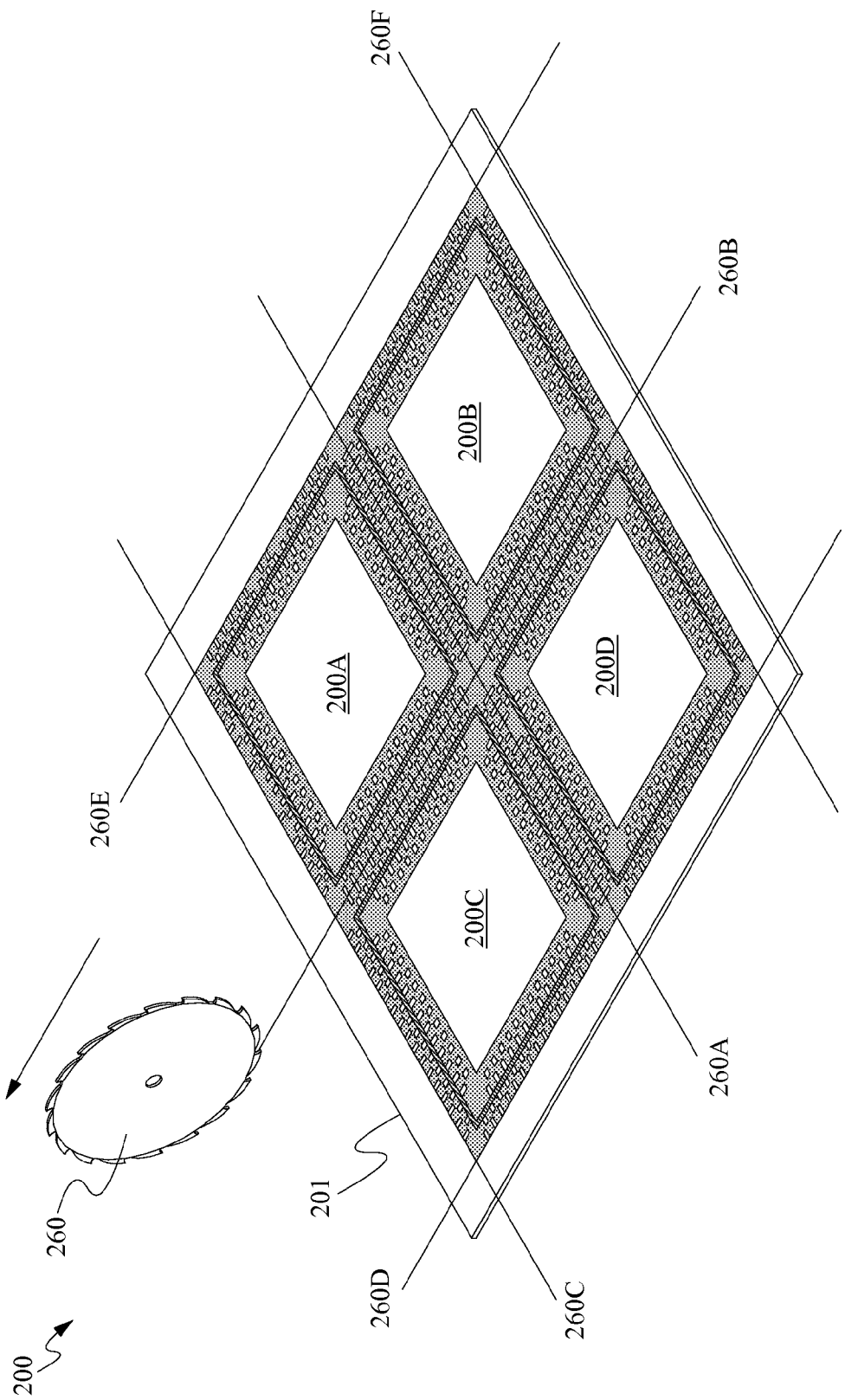
FIG. 3E shows the leadframe of FIG. 2 in a singulation process.

FIG. 3C shows the leadframe 200 before and after being dipped in an etching solution 241 in a vat 242. As described above, the bottom surfaces of the leadframe 200 are substantially covered in an etch resist depicted by the shaded regions, except for the support member 209. On the top surface, any previously exposed copper is encased in the mold compound 230 in FIG. 3B and is therefore etch-resistant. Preferably, the frame 201 shown in FIG. 2 is coated in an etch resist on both the top and bottom sides in order to preserve the perimeter for convenience in later processing steps. As a result of dipping the leadframe in the etching solution 241, the support member 209 is sacrificed. Advantageously, the several sets of contacts 202-205 are electrically isolated with respect to each other. When the support member 209 is etched away, what is left behind is a groove 240 that substantially circumscribes at least the first row of contact pads 202 on each of the individual units 200A-200D. FIG. 3D shows an optional step of filling the groove 240 with an epoxy 250. The epoxy 250 is able to be injected into the groove 240 by a nozzle 255. Alternatively, the epoxy 250 is able to be pressed into the groove 240 by a mold. In other embodiments, a second molding step may be used to fill the groove with mold compound. FIG. 3E shows the leadframe 200 being singulated into individual semiconductor packages 200A-200D. Preferably, a saw 260 cuts along the lines 260A and 260B to singulate the devices. The saw lines 260C-260F separate the frame 201 from the devices 200A-200D. In embodiments wherein the fourth set of contact pads 205 in FIG. 2 are anchored to the frame 201, the singulation step also serves to electrically isolate the contact pads in the fourth set of contact pads 205 with respect to each other.

Figure 4A:
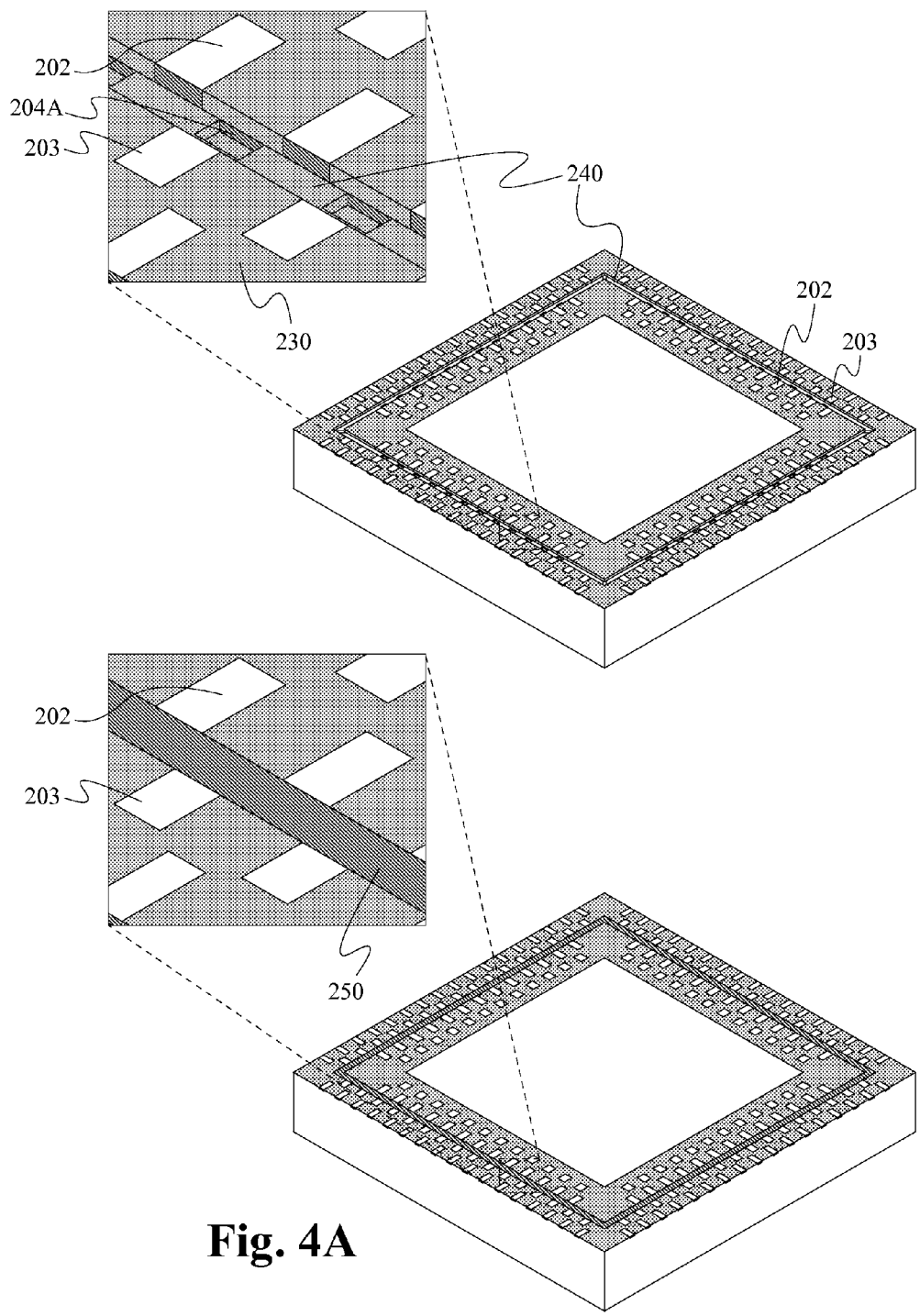
FIG. 4A shows semiconductor packages per embodiments of this invention.
Figure 4B:
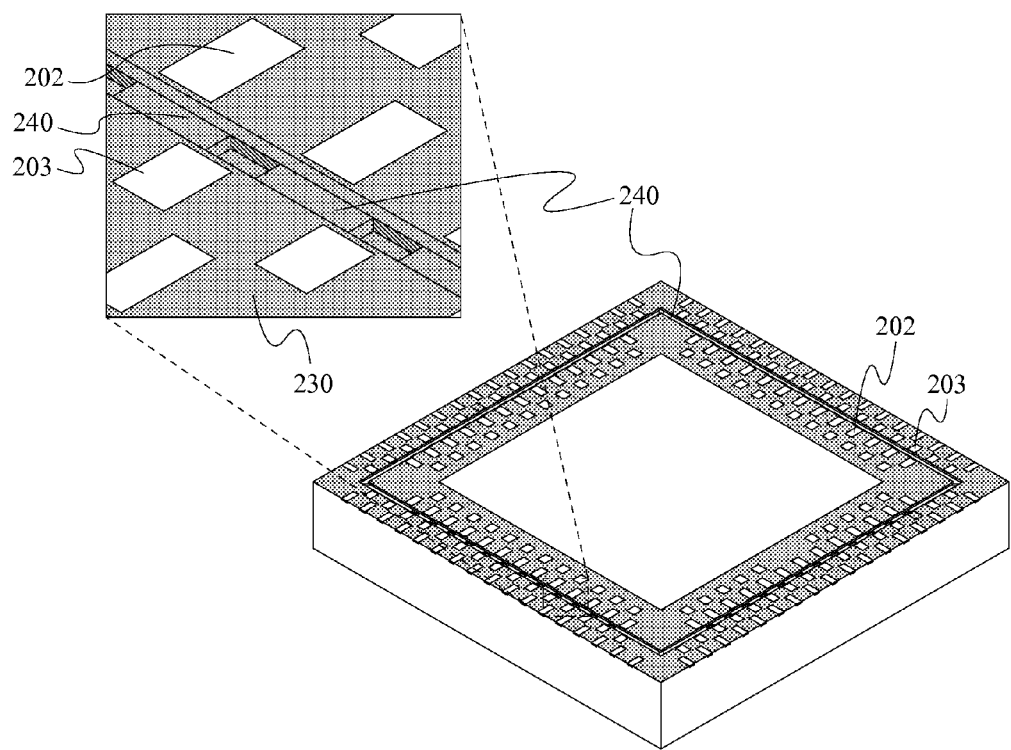
FIG. 4B shows semiconductor packages per embodiments of this invention.

FIGS. 4A and 4B show exemplary configurations for the first set of contacts 202 and the second set of contacts 203 with respect to the groove 240 that was formed when the support member 209 was etched away as shown in FIG. 3C. FIG. 4A shows the first row of contacts 202 and second row of contacts 203 exposed by the groove 240 and an embodiment wherein the groove 240 has been filled in with epoxy 250. In the embodiment wherein the groove is exposed, the portion of the anchor bar 204A that has not been sacrificed by the etching process can be seen within the groove 240. In embodiments wherein the optional epoxy filler 250 has been filled into the groove 240, the first and second set of contacts 202 and 203 are adjacent to the epoxy filler 250. FIG. 4B shows an alternative embodiment wherein the first set of contacts 202 and second set of contacts 203 are offset from the groove 240. In such embodiments, the first set of contacts 202 and second set of contacts 203 are anchored to the support member 209 of FIG. 2 by standoff members (not shown). Although this exemplary embodiment shows both the first set 202 and second set 203 of contacts offset from the groove 240, any combination of the sets of contacts are able to be offset from the groove 240.

Figure 5A:
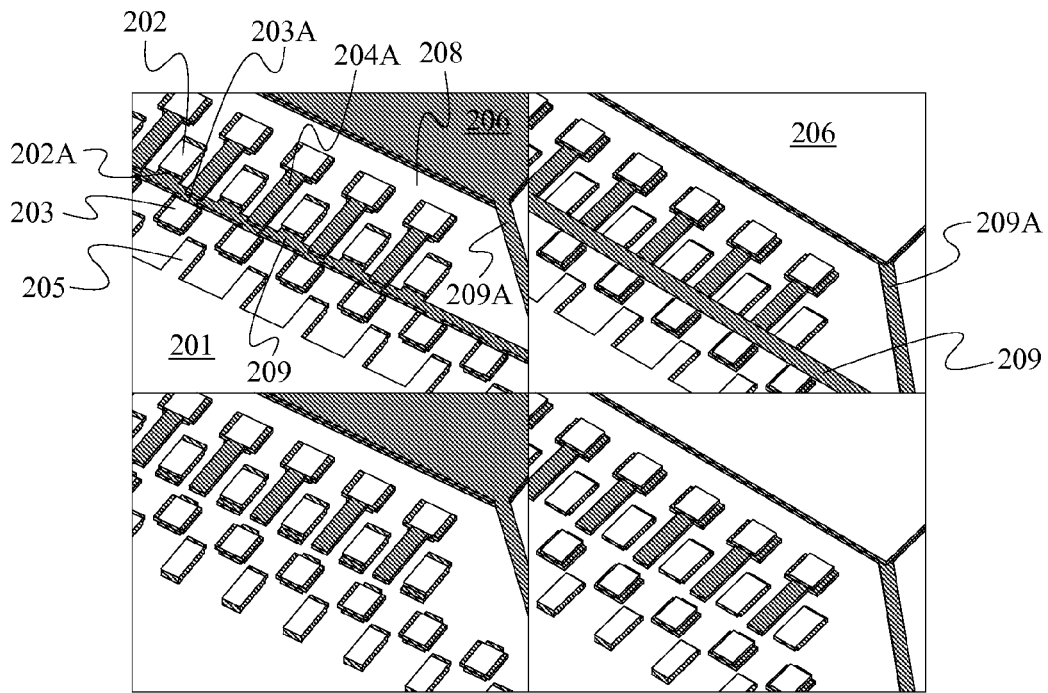
FIG. 5A shows an embodiment of the leadframe of FIG. 2 before and after an etching process.
Figure 5B:
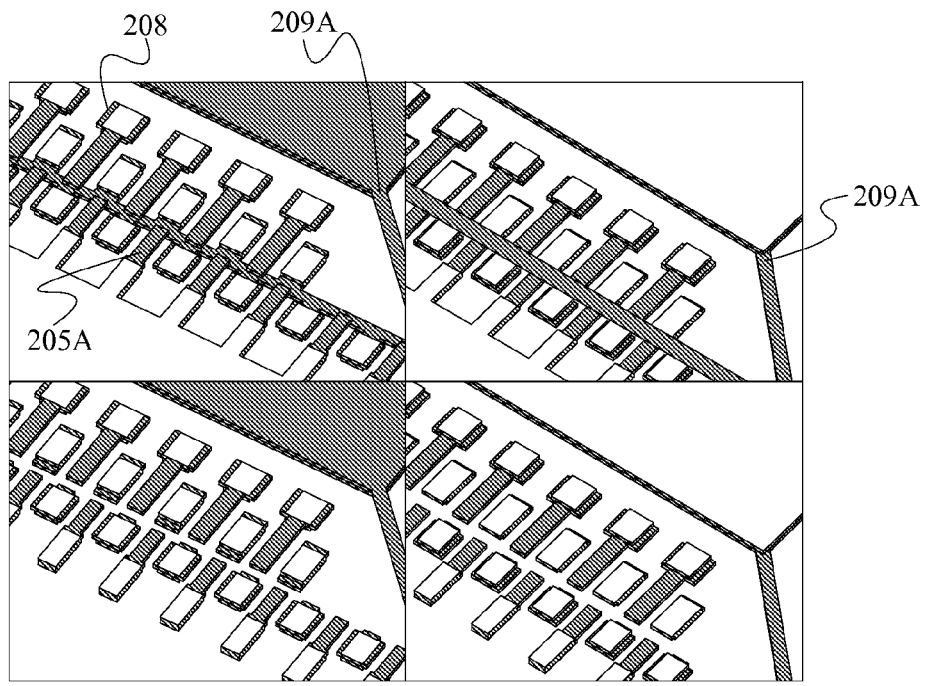
FIG. 5B shows an embodiment of the leadframe of FIG. 2 before and after an etching process.

FIGS. 5A and 5B show exemplary arrangements of the several rows of contact pads 202-205 and the support member according to various embodiments of the present invention. FIG. 5A shows the leadframe 200 on a top and a bottom side both before and after removal of the support member 209 and frame 201. In this depiction, the mold compound, wirebonds and semiconductor die are not shown for the sake of clarity. However, it will be understood by the person of ordinary skill having the benefit of this disclosure that the "after" representations would include those elements. Before etching and singulation, the first set of contacts 202, second set of contacts 203 and third set of contacts 204 are anchored to the support member 209. The third set of contacts 204 is anchored to the support member 209 by anchor bars 204A. In this embodiment, the anchor bars 204A are elevated with respect to the support member 209. Advantageously, when the support member 209 is removed in a later processing step, the anchor bars 204A are encased in a mold compound and therefore not exposed to the exterior of the resultant semiconductor package. The first row of contacts 202 is anchored to the support member 209 by standoffs 202A. In the example of FIG. 5A, the top surfaces of the contacts pads in the first set 202 are offset from the support member 209. Similarly, the second set of contact pads 203 are anchored to the support member 209 standoffs 203A. Alternatively, the set of contacts 202 or 203 are able to be anchored directly to the support member 209. In the embodiment of FIG. 5A, the fourth set of contacts 205 is anchored to the frame 201. The fourth set of contacts 205 is flush on a top and bottom surface with the frame 201. Alternatively, the fourth set of contacts 205 is able to be offset from the frame 201 by standoffs. In such embodiments, the fourth set of contacts 205 will not be exposed to a side surface of the resultant semiconductor package. In the embodiment shown in FIG. 5A, when the frame 201 is sawn away during singulation, the fourth set of contacts 205 will be exposed to a side of the resultant semiconductor package. In such embodiments, an end user of the semiconductor package will be able to probe the individual contact pads in the fourth set of contact pads 205 even after the semiconductor package has been mounted to an end application, such as a circuit board. In the embodiment shown in FIG. 5B, the fourth set of contacts 205 is anchored to the frame 201 and to the support member 209. The fourth set of contacts 205 is anchored to the support member via anchor bars 205A. Alternatively, the fourth set of contacts is able to be anchored only to the support member 209. The anchor bars 205A are preferably elevated with respect to the support member 209. Advantageously, the anchor bars 205A will be encased in mold compound and will not be exposed to any outer surface of the resultant semiconductor package. Furthermore, the cross members 209A are also elevated with respect to the support member 209. Persons of ordinary skill with the benefit of this disclosure will appreciate that forming the various elements such as the offset standoffs 202A and 203A, the cross member 209A, or any other element having faceted characteristics is able to be achieved during a partial etching process.

Figure 6A:
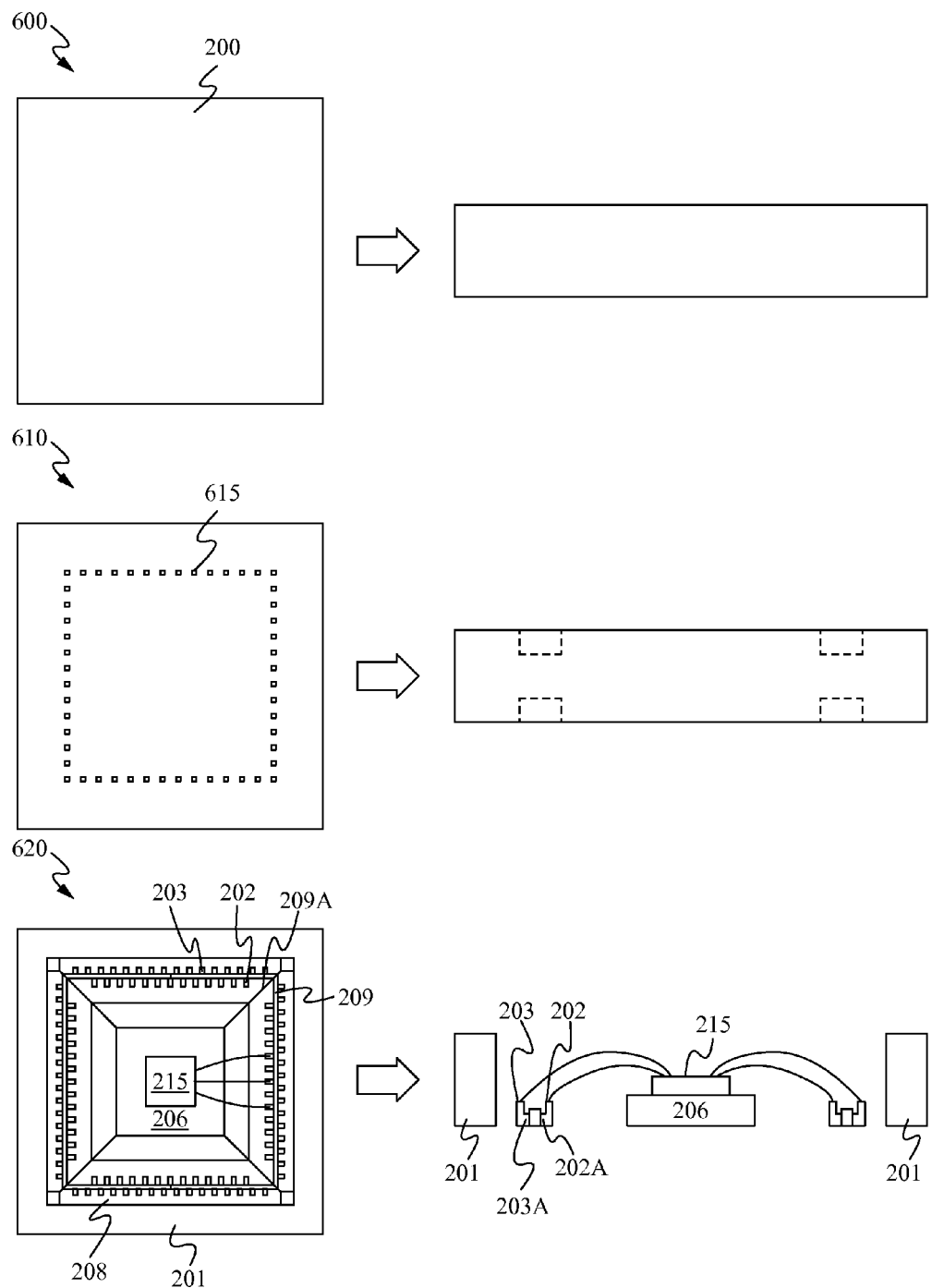
FIG. 6A shows a flowchart of method steps per an embodiment of the invention.
Figure 6B:
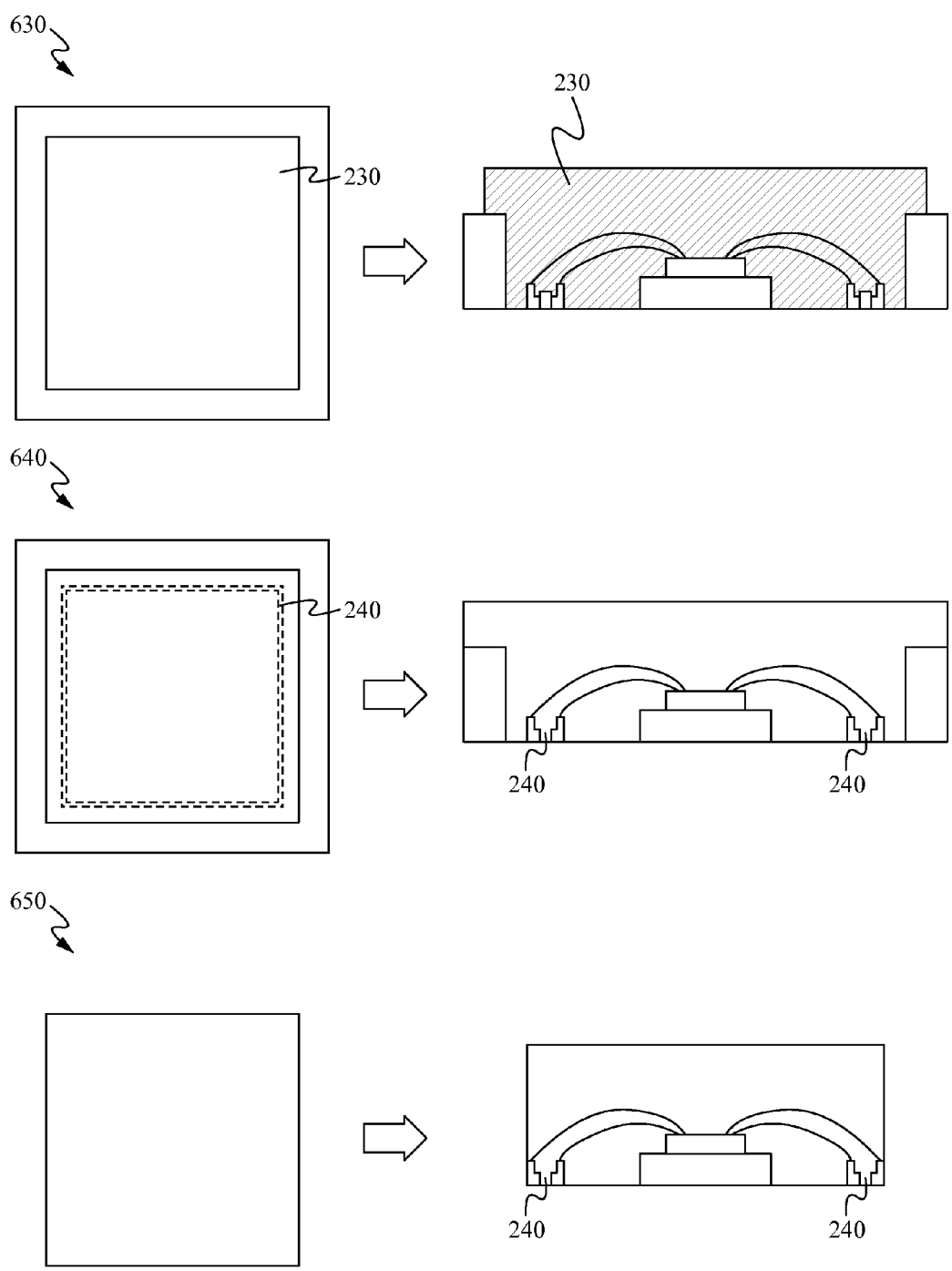
FIG. 6B shows a flowchart of method steps per an embodiment of the invention.

FIGS. 6A and 6B are a flowchart showing the process steps for making the leadframe and the semiconductor device described above. Each step is shown in a top view and a side cutaway view for clarity. In a step 600, a substantially planar copper leadframe 200 is provided. In a step 610, patterns 615 are partially etched on a top and a bottom side of the leadframe 200. These patterns are able to later form the raised anchor bars 204A and 205A, the standoffs 202A and 203A, the elevated cross member 209A-209D, or any other structure discussed above or advantageous to the semiconductor package. In a step 620, a pattern is through etched thereby forming the first set of contacts 202, the second set of contacts 203, the support member 209, die attach pad 206, and cross members 209A-209D. In the example of FIG. 6, only two sets of contact pads are formed. However, as discussed above, any number of contact pads may be added. Thereafter, a die 215 is mounted on the die attach pad 206 and wirebonds electrically couple the semiconductor die 215 to the several contact pads. In a step 630, the leadframe 200 is encased in a mold compound 230. In a step 640, the support member is etched away, leaving a groove 240. Advantageously, the first set 202 and second set 203 of contact pads are electrically isolated with respect to each other. Optionally, the groove 240 is able to be filled with epoxy or mold compound. Finally, in a step 650, the device is singulated, forming a complete semiconductor package.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of making a semiconductor package comprising:
   a. etching a through pattern in a metal substrate, thereby forming a die attach pad, a first set of contact pads surrounding the die attach pad, a second set of contact pads surrounding the first set of contact pads, and a third set of contact pads between the first set of contact pads and the die attach pad, wherein the first and the second set of contact pads are coupled with a support member that is anchored to the die attach pad by cross members, wherein the support member and the cross members are coplanar, wherein each contact pad of the third set of contact pads includes an anchor bar;
   b. mounting at least one semiconductor die on the die attach pad;
   c. mounting bondwires for electrically coupling the at least one semiconductor die to at least one contact pad;
   d. at least partially encasing the semiconductor die, bondwires and contact pads in a mold compound while leaving one surface of the metal substrate exposed; and
   e. etching away the support member, thereby electrically isolating the first set of contact pads and second set of contact pads with respect to each other and thereby also forming a groove such that a portion of each anchor bar abuts the groove.

2. The method of claim 1, further comprising filling the groove with an epoxy.

3. The method of claim 1, wherein the third set of contact pads surrounds the die attach pad and is bounded by the first set of contact pads, the second set of contact pads, and the support member.

4. The method of claim 1, wherein the first set of contact pads and the second set of contact pads are offset from the groove.

5. The method of claim 1, wherein the groove substantially circumscribes the first set of contact pads.

6. The method of claim 2, wherein filling the groove further comprises using a nozzle to inject the epoxy in the groove.

7. The method of claim 2, wherein filling the groove further comprises using a mold to press the epoxy in the groove.

8. The method of claim 1, further comprising filling the groove with mold compound.

9. The method of claim 1, wherein etching a through pattern in a metal substrate further comprises forming a fourth set of contact pads, the fourth set of contact pads surrounding the die attach pad, the first set of contact pads, the second set of contact pads, the third set of contact pads, and the support member.

10. The method of claim 1, wherein the first set of contact pads and the second set of contact pads are coupled to the support member by standoff members.

11. The method of claim 1, wherein the first set of contact pads is bounded by the support member, and the second set of contact pads surrounds the support member.

12. The method of claim 1, further comprising coating the one surface of the metal substrate, except the support member, with etch resist material.

13. A method of making a semiconductor package comprising:
   a. etching a through pattern in a metal substrate, thereby forming a die attach pad, a first set of contact pads surrounding the die attach pad, a second set of contact pads surrounding the first set of contact pads, and a third set of contact pads between the first set of contact pads and the die attach pad, wherein the first and the second set of contact pads are coupled with a support member that is anchored to the die attach pad by cross members, wherein the cross members are raised with respect to the support member, wherein each contact pad of the third set of contact pads includes an anchor bar;
   b. mounting at least one semiconductor die on the die attach pad;
   c. mounting bondwires for electrically coupling the at least one semiconductor die to at least one contact pad;
   d. at least partially encasing the semiconductor die, bondwires and contact pads in a mold compound while leaving one surface of the metal substrate exposed; and e. etching away the support member, thereby electrically isolating the first set of contact pads and second set of contact pads with respect to each other and thereby also forming a groove such that a portion of each anchor bar abuts the groove.

14. The method of claim 13, wherein each anchor bar extends between a respective contact pad of the third set of contact pads and the support member.

15. The method of claim 13, wherein the first set of contact pads and the second set of contact pads are staggered.

16. A method of making a semiconductor package comprising:
   a. etching a through pattern in a metal substrate, thereby forming a die attach pad, a first set of contact pads surrounding the die attach pad, a second set of contact pads surrounding the first set of contact pads, and a third set of contact pads between the first set of contact pads and the die attach pad, wherein the first and the second set of contact pads are coupled with a support member, wherein each contact pad of the third set of contact pads includes an anchor bar;
   b. mounting at least one semiconductor die on the die attach pad;
   c. mounting bondwires for electrically coupling the at least one semiconductor die to at least one contact pad;
   d. at least partially encasing the semiconductor die, bondwires and contact pads in a mold compound while leaving one surface of the metal substrate exposed; and
   e. etching away the support member, thereby electrically isolating the first set of contact pads and second set of contact pads with respect to each other and thereby also forming a groove such that a portion of each anchor bar abuts the groove.

17. The method of claim 16, wherein each anchor bar extends between a respective contact pad of the third set of contact pads and the support member.

18. The method of claim 16, wherein the first set of contact pads and the second set of contact pads are staggered.

\* \* \* \* \*